United States Patent [19]
Lamson

[11] Patent Number: 6,054,758
[45] Date of Patent: Apr. 25, 2000

[54] DIFFERENTIAL PAIR GEOMETRY FOR INTEGRATED CIRCUIT CHIP PACKAGES

[75] Inventor: Michael A. Lamson, Westminster, Tex.

[73] Assignee: Texas Instruments Incorporated, Dallas, Tex.

[21] Appl. No.: 08/991,745

[22] Filed: Dec. 16, 1997

Related U.S. Application Data

[60] Provisional application No. 60/033,673, Dec. 18, 1996.

[51] Int. Cl.[7] .................................................. H01L 23/52
[52] U.S. Cl. ........................................... 257/691; 257/700
[58] Field of Search ..................... 257/691, 700, 257/774

[56] References Cited

U.S. PATENT DOCUMENTS

| | | | |
|---|---|---|---|
| 5,293,069 | 3/1994 | Kato et al. | 257/698 |
| 5,530,287 | 6/1996 | Currie et al. | 257/692 |
| 5,625,225 | 4/1997 | Huang et al. | 257/700 |
| 5,847,935 | 12/1998 | Thaler et al. | 361/761 |

*Primary Examiner*—Teresa M. Arroyo
*Attorney, Agent, or Firm*—Wade James Brady III; Frederick J. Telecky, Jr.

[57] ABSTRACT

An integrated circuit chip package (1) is provided which incorporates one or more differential pairs (20) of signal lines coupled to an integrated circuit chip. The differential pairs each include a first signal line (21) and a second signal line (22). The first signal lines are non-coplanar with the second signal lines. The first signal lines of the differential pairs may be provided in a first plane. The second signal lines of the differential pairs may be provided in a second plane different from the first plane. A first ground plane (51) is provided adjacent the first signal lines and a second ground plane (52) is provided adjacent the second signal lines. The spacing of respective signal lines provides, among other things, the capability of having a greater density of differential pairs of signal lines within the planar area of an integrated circuit chip package.

8 Claims, 2 Drawing Sheets under 35 USC § 119(e)
DIFFERENTIAL PAIR GEOMETRY FOR INTEGRATED CIRCUIT CHIP PACKAGES This application claims priority under 35 USC § 119(e)(1) of provisional application Ser. No. 60/033,673 filed Dec. 18, 1996.

TECHNICAL FIELD OF THE INVENTION

This invention generally relates to differential pairs of signal lines for integrated circuit chip packages and, more particularly, to a differential pair geometry for integrated circuit chip packages.

BACKGROUND OF THE INVENTION

Integrated circuit chip packages are commonly arranged in a particular configuration on a printed circuit board in order to perform a desired electronic function. The integrated circuit chip package may include an integrated circuit chip with one or more signal lines electrically coupled to the circuitry of the chip. The signal lines carry information from the chip to one or more other components on the printed circuit board and carry information from the other components back to the chip. This is typically known as an input/output or I/O function.

In prior integrated circuit chip packages, a single, discrete signal line was dedicated to carrying information from the chip to other components. A separate single transmission line was dedicated to carrying information to the chip. A disadvantage of having discreet input and output signal lines is that, for a given line, noise from external sources can be introduced into the circuit by way of the signal line. In general, noise is undesirable because it degrades the signal being carried by the signal line.

One method for dealing with the problem of noise is to produce signals at a relatively high voltage (e.g., on the order of about five volts) so that the signal will be easily distinguishable from the noise. Integrated circuits are being designed, however, to operate at higher and higher speeds. Therefore, it is desirable to have a faster rise time from a state in which there is no signal to a state in which the signal exists at a functional level. The need for higher speeds and faster rise times is due in part to the increasing signal frequency at which integrated circuits are being designed to operate. One method of improving rise time is to lower the voltage value for a signal. For example, if signal voltage is on the order of about one volt, a faster rise time will be achieved than if the signal voltage is on the order of about five volts. One problem with using lower voltages, however, is that noise on the circuit is harder to distinguish from the signal being transmitted through the circuit.

A method for overcoming this problem is to use differential pairs of signal lines to achieve the input/output function. In such a system, a pair of lines is provided in which one of the lines receives information and the other line transmits information. With a differential pair, the same signal is traveling through both lines except that the polarities of the lines are opposite each other. In this configuration, the noise value on one line will cancel out the noise value on the other line of the pair, thereby achieving noise isolation.

A typical integrated circuit chip package using differential pairs of signal lines is limited in the number of lines which can be incorporated into the package. A factor which limits the number of lines is the impedance characteristic of the differential pair. Impedance in an electrical circuit must be controlled and is typically set at a predetermined value. The impedance level of an integrated circuit chip package and, therefore, of differential pairs within an integrated circuit chip package will be dictated by the electronic device incorporating the integrated circuit chip package. Impedance is generally a function of line width, line height, and separation of the lines from one another in a differential pair. Also contributing to a particular impedance is the distance from a signal line to a ground plane within the integrated circuit chip package. Typical integrated circuit chip packages which incorporate differential pairs of signal lines are formed such that the two signal lines which make up a given differential pair are coplanar. That is, the pair of lines exists in one plane which is parallel to the plane defined by the integrated circuit chip package. Typically, a ground plane is provided in a separate plane which is different from the plane of the differential pair.

Because impedance is affected by the space between pairs and the space between the two lines of a given pair, the typical integrated circuit chip packages is limited in the number of differential pairs which may be provided within given planar area of an integrated circuit chip package. One solution is to make the lines themselves smaller, thereby allowing more pairs to coexist in a given plane. However, the capabilities within the industry in this respect are limited. Even using the smallest wires that are available in industry, it is desirable to be able to have more pairs of signal lines within a given planar area of an integrated circuit chip package. Also, developing and producing smaller lines of differential pairs is costly. Further, if a line is designed to be too small, then the line might not adequately carry a signal and may become more susceptible to damage or deterioration.

SUMMARY OF THE INVENTION

It is an object of the present invention, therefore, to solve these and other shortcomings of prior integrated circuit chip packages incorporating differential pairs of signal lines.

It is another object of the present invention to provide an integrated circuit chip package incorporating differential pairs of signal lines in which greater numbers of differential pairs may be provided within the planar area of a given integrated circuit chip package.

It is another object of the present invention to provide an integrated circuit chip package having a greater density of differential pairs of signal lines without substantially increasing the cost of manufacturing the integrated circuit chip package.

According to a first embodiment of the present invention, an integrated circuit chip package is provided which includes an integrated circuit chip. At least one differential pair of signal lines is connected to the integrated circuit chip. The at least one differential pair includes a first signal line, and a second signal line which is non-coplanar with the first signal line.

According to one aspect the package defines a plane. The first signal line is disposed within a first plane parallel to the plane of the package. The second signal line is disposed within a second plane parallel to the plane of the package and spaced from the first plane. According to another aspect, the first and second signal lines are disposed at different levels with respect to a thickness of the package. According to another aspect, the first and second signal lines are each intersected by a common normal of the package.

The integrated circuit chip package may include a plurality of differential pairs, each having a first and a second signal line. At least one of the first signal lines is non-coplanar with at least one of the second signal lines. At least one of the first signal lines and at least one of the second signal lines may be intersected by a common normal of the package.

The integrated circuit chip package may also include one or more ground planes. Preferably, the package includes at least two ground planes. A first ground plane may be provided adjacent the first signal line and a second ground plane may be provided adjacent the second signal line. The ground planes may be connected by vias.

According to a second embodiment of the present invention, an integrated circuit chip package includes an integrated circuit chip. The package also includes a first differential pair of signal lines electrically connected to the integrated circuit chip and a second differential pair of signal lines electrically connected to the integrated circuit chip. The first differential pair is non-coplanar with the second differential pair.

The first and second differential pairs may be intersected by a common normal of the package. The first differential pair may be spaced along the common normal from the second differential pair. Each of the differential pairs includes two non-coplanar signal lines.

According to a third embodiment of the present invention, a method for manufacturing an integrated circuit chip package is provided. The method includes several steps. A first layer is formed from an encapsulation material. A second layer is a conductive material and is formed on the first layer. A third layer is the encapsulation material and is formed on the second layer. A fourth layer is a conductive material and includes a first signal line. The fourth layer is formed on the third layer. A fifth layer is the encapsulation material and is formed on the fourth layer. A sixth layer is a conductive material and includes a second signal line. The sixth layer is formed on the fifth layer.

A seventh layer of an encapsulation material may be formed on the sixth layer. An eighth layer of a conductive material may be formed on the seventh layer. A ninth layer of an encapsulation material may be formed on the eighth layer. The first and second signal lines may be intersected by a common normal of the package.

A technical advantage of the present invention is that it increases the number of differential pairs of signal lines which may be provided within a given planar area as compared to prior integrated circuit chip packages.

Another technical advantage of the present invention is that greater numbers of differential pairs of signal lines may be provided in an integrated circuit chip package without decreasing the size of the signal lines.

Another technical advantage of the present invention is improved electrical isolation from cross talk noise between signal pairs.

Other aspects, features and technical advantages of the present invention will be readily apparent to those having ordinary skill in the relevant art.

BRIEF DESCRIPTION OF THE DRAWINGS

For a more complete understanding of the present invention and for advantages thereof, reference is now made to the following description taken in conjunction with the accompanying drawings, wherein like reference numerals represent like parts, in which.

DETAILED DESCRIPTION OF THE INVENTION

In general, the present invention provides a differential pair geometry for allowing greater numbers of differential pairs of input/output signal lines to be provided within a given planar area of an integrated circuit chip package. The two lines in each of the pairs are offset from each other and are disposed in separate planes as opposed to being coplanar.

Figure 1:
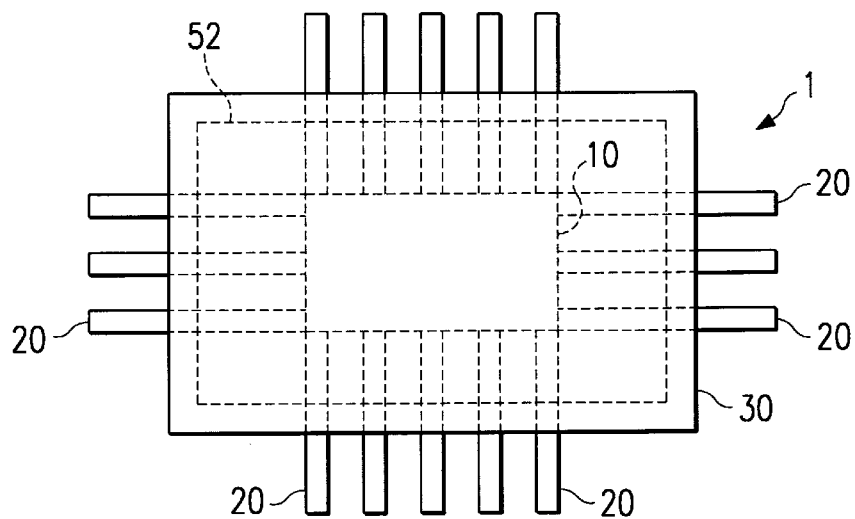
FIG. 1 is a planar view of an integrated circuit chip package in accordance with a first embodiment of the present invention.

As shown in FIG. 1, an integrated circuit chip package 1 according to a first embodiment of the present invention comprises integrated circuit chip 10 having at least one differential pair 20 of signal lines electrically coupled to chip 10 and extending therefrom. Preferably, a plurality of differential pairs 20 of signal lines is incorporated into package 1. The integrated circuit chip 10 and a portion of the signal lines may be encapsulated in a dielectric 30. The integrated circuit chip 10 may be any typical integrated circuit chip which can perform any desired electrical function. Preferably, integrated circuit chip 10 is of a type suitable for high speed performance. The signal lines are provided in differential pairs 20 to provide an input/output function for integrated circuit chip 10 relative to other components (not shown) which are electrically coupled to package 1. Chip 10 and the other components may be disposed for example, on a printed circuit board (not shown). Dielectric 30 may comprise any suitable dielectric such as polyimide, FR4$^{TM}$, BT$^{TM}$ resins or a ceramic.

The present invention may be used wherever differential pairs of signal lines are provided. This includes, for example, use with wire bonded or flip-chip type integrated circuit chip packages. Also, the differential pair geometry may be used in conjunction with any type of mounting arrangement relating to the mounting of the integrated circuit chip package to a printed circuit board. This includes, for example, ball grid array, pin grid array, or surface mounted peripheral packages.

Figure 2:
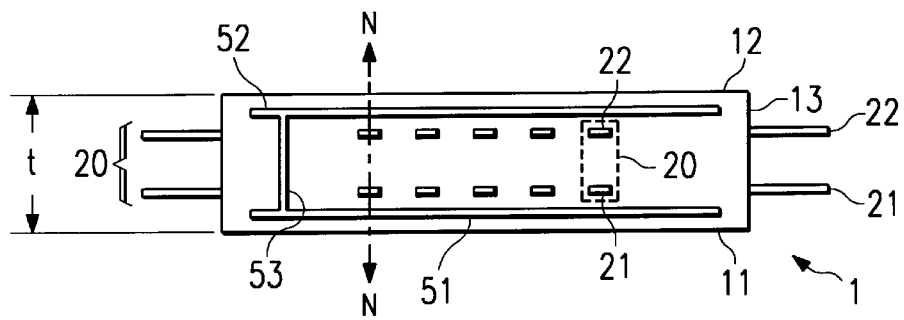
FIG. 2 is a side view of the integrated circuit chip package of FIG. 1.

As seen in FIG. 2, each differential pair 20 includes at least one first signal line 21 and at least one second signal line 22. The signal lines of differential pairs 20 may comprise copper or any other conductive metal. Thus, a plurality of first signal lines 21 and a plurality of second signal lines 22 are preferably provided. The signal lines may be electrically connected to chip 10, for example, at bond pads (not shown) of chip 10.

Although the package 1 has a thickness (e.g., as designated by dimension "t" in FIG. 2), package 10 may be viewed as defining a plane. For example, package 10 has a first side surface 11 and a second side surface 12 which are connected to each other by a perimeter surface 13. Preferably, the first and second side surfaces 11 and 12 are planar and parallel to the plane defined by the package 1. The planar area of the package is the area of either first or second side surface 11 or 12.

Each of the first signal lines 21 is preferably disposed in a first plane and each of the second signal lines 22 is disposed in a second plane different from the first plane. The first and second planes are preferably parallel to each other and to the plane of the integrated circuit chip package. Therefore, the first and second planes are each parallel to the first and second side surfaces 11 and 12.

Preferably, for each differential pair 20, the first and second signal lines 21 and 22 are both intersected by a common normal to the package 1. For example, as shown in FIG. 2, the first and second lines of a differential pair are shown being intersected by a normal N—N of package 1.

A first ground plane 51 is provided adjacent the first signal lines 21 and a second ground plane 52 is provided adjacent the second signal lines 22. Preferably, first ground plane 51 and second ground plane 52 are coupled to each other by way of one or more vias 53 but are isolated from the respective signal lines of the differential pairs 20. Preferably, vias are provided in package 1 to interconnect first and second ground planes 51 and 52. Optionally, first and second ground plains 51 and 52 may jointly terminate, for example, at the bond pads of the integrated circuit chip. Preferably, first signal lines 21 are disposed between first ground plane 51 and second signal lines 22. Preferably, second signal lines 22 are disposed between first signal lines 21 and second ground plane 52. Ground planes 51 and 52 provide a ground, carry a ground current to the chip and establish system impedance (together with other factors such as line width and separation).

Figure 3:
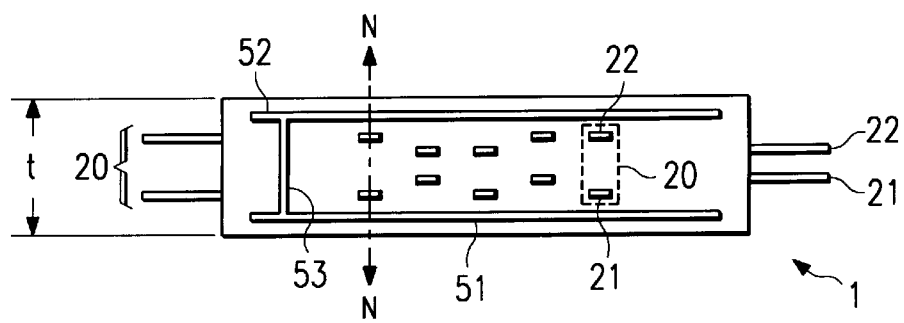
FIG. 3 is a side view of an integrated circuit chip package in accordance with an alternative feature of the first embodiment of the present invention.

According to an aspect of this embodiment, the first lines 21 do not necessarily have to each be disposed within a single plane. Similarly, the second lines 22 do not have to be disposed in the same plane. Greater numbers of differential pairs 20 can be provided within the planar area of the package 1 as long as the first lines 21 are not coplanar with the second lines 22. For example, as shown in FIG. 3, for a given differential pair the first line 21 is located at a first level within the thickness of the integrated circuit chip package and the second line 22 is located at a second level different from the first level. However, all of the first lines 21 are not in a single plane and all of the second lines 22 are likewise not in a single plane. Preferably, for each differential pair 20, the first and second lines are still intersected by a common normal (e.g., N—N in FIG. 3) of the package 1.

Figure 4:
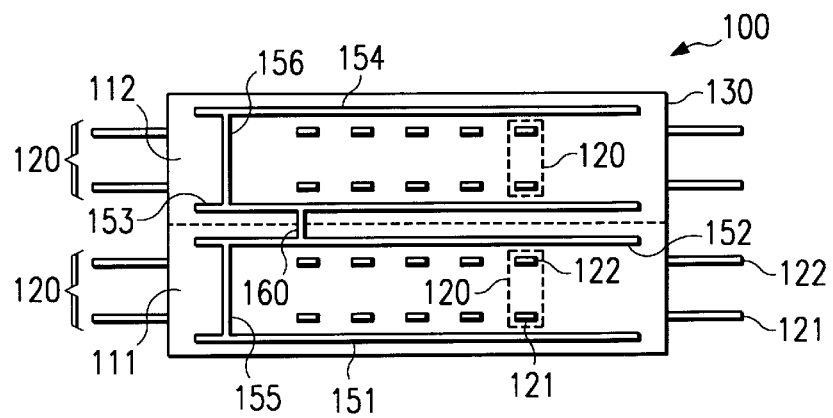
FIG. 4 is a side view of an integrated circuit chip package according to a second embodiment of the present invention.

As shown in FIG. 4, in a second embodiment of the present invention, an integrated circuit chip package 100 is provided which includes two layers of the type discussed above in connection with FIGS. 1–3. Integrated circuit chip package 100 has differential pairs of signal lines 120 extending therefrom. In a first layer 111, the differential pairs include first signal lines 121 and second signal lines 122. A first ground plane 151 is disposed adjacent first signal lines 121 and a second ground plane 152 is provided adjacent second signal lines 122. Preferably, first signal lines 121 are disposed between first ground plane 151 and second signal lines 122. First and second ground planes may be connected by way of one or more vias 155.

In a second layer 112, the differential pairs 120 include third signal lines 123 and fourth signal lines 124. A third ground plane 153 is disposed adjacent third signal lines 123 and a fourth ground plane 154 is disposed adjacent fourth signal lines 124. Preferably, third signal lines 123 are disposed between third ground plane 153 and fourth signal lines 124. Preferably, fourth signal lines 124 are disposed between third signal lines 123 and fourth ground plane 154. Third and fourth ground planes 153 and 154 may be connected by one or more vias 156.

The signal lines 121, 122, 123, 124 are electrically connected at one end to an integrated circuit chip (not shown) as with the previous embodiment. These components are preferably encapsulated in a dielectric 130. Second and third ground planes 152 and 153 may be electrically connected to each other by way of one or more vias 160. According to an aspect of this embodiment, other layers may be stacked in the manner of layers 111 and 112. According to another aspect, the integrated circuit chip package 100 may be reconfigured so that the ground planes existing between respective layers, for example, ground planes 152 and 153 are replaced with a single ground plane. As with the previous embodiment, the ground planes may comprise the same material as the signal lines (e.g., copper) or some other conductive material different from that used for the signal lines.

Figure 5:
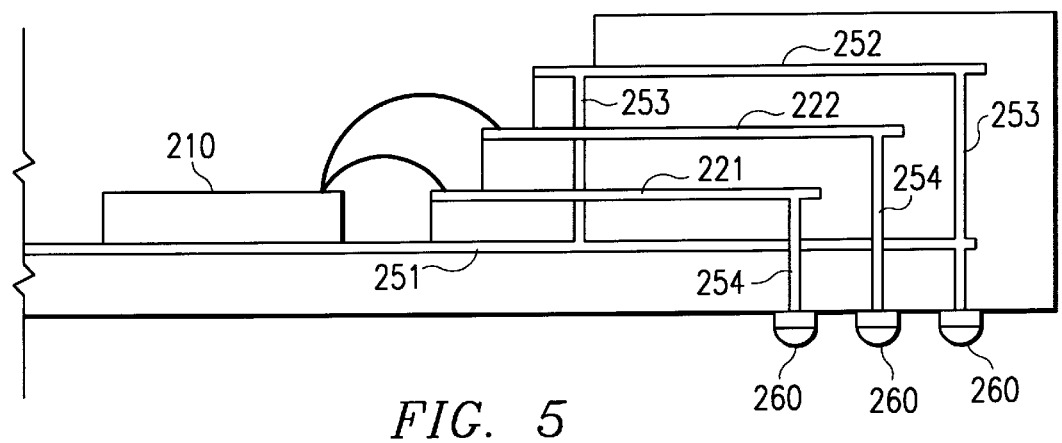
FIG. 5 is a side view of an integrated circuit chip package according to a third embodiment of the present invention.

According to an alternative aspect of the present invention, and as shown in FIG. 5, a ball grid array package includes at least one differential pair of non-coplanar signal lines. As shown, a differential pair of signal lines comprises first and second signal lines 221 and 222, which are oriented as described above. The lines are intersected by a common normal of the package as opposed to being in a side-by-side configuration. In other words, each line of the pair is provided in separate planes. Preferably, the planes of the signal lines are parallel to each other and to a plane defined by the package. Chip 210 is provided and spaced laterally apart from the signal lines. First and second ground planes 251 and 252 are provided in a manner similar to the previous embodiments and are interconnected by vias 253. Vias 254 interconnect the first and second signal lines 221 and 222 to solder ball connectors 260, which may be used to connect the package to a printed circuit board (not shown), for example.

According to a method of producing the integrated circuit chip packages of the present invention, a first layer is formed which comprises an encapsulation material which may serve as a substrate dielectric. This layer protects the inner components of the package. A second layer is provided on the first layer. The second layer comprises a layer of conductive material which serves as the first ground plane. A third layer is provided on the second layer. The third layer comprises the encapsulation material and isolates the first ground plane from the first signal lines. A fourth layer is provided on the third layer and comprises another layer of conductive material. Portions of the fourth layer may be removed to leave the first signal lines of the respective differential pairs of signal lines. A fifth layer is provided on the fourth layer and comprises the encapsulation material. This layer isolates the first signal lines from the second signal lines. A sixth layer is is provided on the fifth layer. The sixth layer comprises a conductive material, of which portions may be removed to leave the second signal lines of the respective differential pairs. A seventh layer is provided on the sixth layer and comprises the encapsulation material. The seventh layer isolates the second signal lines from the second ground plane. An eighth layer is provided on the seventh layer and comprises a conductive material to serve as the second ground plane. A ninth layer is provided on the eighth layer and comprises the encapsulation material. This layer completes the encapsulation process and protects the inner components of the package from the environment. The various layers may be provided by a known deposition technique.

Although this method of manufacturing the integrated circuit chip packages is provided as example, any typical construction method for integrated circuit chip packages may be used so long as the first signal lines are non-coplanar with the second signal lines. Another example method of manufacturing the integrated circuit chip package is to use a ceramic substrate upon which a tungsten conductor is printed. The printed ceramic substrate is then fired in a kiln to cure the tungsten conductors.

The different dimensions of the integrated circuit chip package such as the space between the first signal line and the second signal line of a given pair, the space between different differential pairs, and the space between given lines and their adjacent ground planes will be dictated by the impedance set for the integrated circuit chip package. This, in turn, will be determined by the circuit impedance for the overall electronic circuit incorporating the integrated circuit chip package.

Although the present invention and its advantages have been described in detail, it should be understood that various changes, substitutions, and alterations can be made therein without departing from the spirit and scope of the invention as defined by the appended claims.

What is claimed is:

1. An integrated circuit chip package, comprising:

an integrated circuit chip disposed in said package, said package having a planar surface; and at least one differential pair of signal lines connected to the integrated circuit chip, the at least one differential pair including a first signal line and a second signal line, the first and second signal lines each being disposed in spaced apart planes each parallel to said planar surface;

a line normal to said planar surface passing through each of said signal lines of said differential pair.

2. The integrated circuit chip package of claim 1, further comprising a first ground plane adjacent the first signal line.

3. The integrated circuit chip package of claim 2, the first signal line being disposed between the first ground plane and the second signal line.

4. The integrated circuit chip package of claim 3, further comprising a second ground plane parallel to the first ground plane and adjacent the second signal line, the second signal line being disposed between the first signal line and the second ground plane.

5. The integrated circuit chip package of claim 4, the first and second ground planes being electrically connected by one or more vias.

6. The integrated circuit chip package of claim 1, the at least one differential pair comprising a plurality of differential pairs, each signal pair including a first and a second signal line, each said signal pair being being disposed in planes parallel to said planar surface, the first signal line being non-coplanar with the second signal line;

a line normal to said planar surface passing through each of said signal lines of each of said differential pairs.

7. An integrated circuit chip, comprising:

an integrated circuit chip and having a planar surface; and at least one differential pair of signal lines connected to the integrated circuit chip, the at least one differential pair including a first signal line and a second signal line, the first and second signal lines each being disposed in spaced apart planes each parallel to said planar surface;

a line normal to said planar surface passing through each of said signal lines of said differential pair.

8. The integrated circuit chip of claim 7, the at least one differential pair comprising a plurality of differential pairs, each signal pair including a first and a second signal line, each said signal pair being disposed in planes parallel to said planar surface, the first signal line being non-coplanar with the second signal line;

a line normal to said planar surface passing through each of said signal lines of each of said differential pairs.

* * * * *